United States Patent
Che et al.

(10) Patent No.: US 11,152,367 B1
(45) Date of Patent: Oct. 19, 2021

(54) SEMICONDUCTOR STRUCTURE AND INTEGRATED CIRCUIT

(71) Applicant: Powerchip Semiconductor Manufacturing Corporation, Hsinchu (TW)

(72) Inventors: Shyng-Yeuan Che, Hsinchu County (TW); Shih-Ping Lee, Hsinchu (TW); Bo-An Tsai, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/008,642

(22) Filed: Sep. 1, 2020

(30) Foreign Application Priority Data

Apr. 15, 2020 (TW) .................................. 109112695

(51) Int. Cl.
*G11C 11/4097* (2006.01)
*H01L 27/108* (2006.01)

(52) U.S. Cl.
CPC ........ *H01L 27/108* (2013.01); *G11C 11/4097* (2013.01)

(58) Field of Classification Search
CPC ............................ G11C 11/4097; H01L 27/108
USPC .............................................. 365/149, 230.06
See application file for complete search history.

(56) References Cited

U.S. PATENT DOCUMENTS 6,150,198 A   11/2000  Wen
8,012,810 B2   9/2011  Wang et al.
8,890,227 B1  11/2014  Chen et al.
10,020,311 B1  7/2018  Li et al.
2007/0114631 A1  5/2007  Sato et al.
2011/0116324 A1*  5/2011  Haggag .............. G11C 16/0433
                                                      365/185.29

(Continued)

FOREIGN PATENT DOCUMENTS

TW   468273   12/2001
TW   469631   12/2001
TW   472340    1/2002

OTHER PUBLICATIONS

"Office Action of Taiwan Counterpart Application", dated Feb. 24, 2021, p. 1-p. 4.

*Primary Examiner* — Michael T Tran
(74) *Attorney, Agent, or Firm* — JCIPRNET

(57) ABSTRACT

A semiconductor structure and an integrated circuit are provided. The semiconductor structure includes first well regions and a second well region in a semiconductor substrate; first transistors within the first wells; second transistors within the second well; and bit lines. The first wells are separately arranged along a first direction and a second direction. The second well continuously spreads between the first wells. Each first transistor and one of the second transistors are adjacent and connected to each other via a common source or common drain. The common drain or common source is electrically connected to a storage capacitor, and the electrically connected first and second transistors as well as the storage capacitor form a memory cell. The bit lines respectively extend between adjacent rows of the first wells. Adjacent memory cells arranged along the second direction are electrically connected to the same bit line.

14 Claims, 6 Drawing Sheets

(56) References Cited

U.S. PATENT DOCUMENTS

| | | | | |
|---|---|---|---|---|
| 2011/0176377 A1* | 7/2011 | Koyama | G11C 29/82 | 365/200 |
| 2011/0227062 A1* | 9/2011 | Kato | H01L 27/11521 | 257/43 |
| 2011/0316060 A1* | 12/2011 | Yao | G11C 16/0433 | 257/298 |
| 2012/0033487 A1* | 2/2012 | Inoue | H01L 21/441 | 365/149 |
| 2012/0039126 A1* | 2/2012 | Saito | G11C 11/40615 | 365/185.08 |
| 2012/0051118 A1* | 3/2012 | Yamazaki | G11C 14/0018 | 365/149 |
| 2012/0120706 A1* | 5/2012 | Ohgami | H01L 27/10882 | 365/72 |
| 2012/0275245 A1* | 11/2012 | Sekine | G11C 11/4096 | 365/189.15 |
| 2013/0148412 A1* | 6/2013 | Ohgami | G11C 11/4091 | 365/149 |
| 2013/0161607 A1* | 6/2013 | Yoneda | H01L 27/1225 | 257/43 |
| 2013/0162306 A1* | 6/2013 | Inoue | G11C 11/403 | 327/109 |
| 2013/0229849 A1* | 9/2013 | Kawashima | G11C 14/0072 | 365/145 |
| 2014/0022844 A1* | 1/2014 | Yao | H01L 29/4916 | 365/185.08 |
| 2014/0269099 A1* | 9/2014 | Nagatsuka | H01L 27/1156 | 365/185.23 |
| 2015/0023114 A1* | 1/2015 | Kurokawa | G11C 11/405 | 365/189.011 |
| 2016/0155480 A1* | 6/2016 | Inoue | H01L 27/0688 | 365/72 |
| 2017/0125420 A1* | 5/2017 | Matsuzaki | H01L 29/78696 | |
| 2018/0114578 A1* | 4/2018 | Ishizu | G11C 11/401 | |
| 2018/0138208 A1* | 5/2018 | Ito | H01L 27/115 | |
| 2018/0174647 A1* | 6/2018 | Takahashi | G11C 11/405 | |
| 2019/0371802 A1* | 12/2019 | Morris | H01L 28/55 | |
| 2020/0111512 A1* | 4/2020 | Kim | H01L 27/105 | |
| 2020/0185370 A1* | 6/2020 | Juengling | H01L 25/18 | |
| 2020/0211643 A1* | 7/2020 | Roy | G11C 13/0097 | |
| 2020/0265887 A1* | 8/2020 | Atsumi | H01L 27/1156 | |
| 2020/0266289 A1* | 8/2020 | Yamazaki | H01L 21/8221 | |
| 2020/0279601 A1* | 9/2020 | Kim | H01L 27/10873 | |
| 2020/0302993 A1* | 9/2020 | Tanaka | G11C 11/4097 | |
| 2020/0350315 A1* | 11/2020 | Son | H01L 27/10873 | |
| 2020/0373312 A1* | 11/2020 | Sharma | H01L 27/11507 | |
| 2021/0104279 A1* | 4/2021 | Wu | G11C 16/0416 | |

\* cited by examiner

SEMICONDUCTOR STRUCTURE AND INTEGRATED CIRCUIT

CROSS-REFERENCE TO RELATED APPLICATION

This application claims the priority benefit of Taiwan application serial no. 109112695, filed on Apr. 15, 2020. The entirety of the above-mentioned patent application is hereby incorporated by reference herein and made a part of this specification.

BACKGROUND

Technical Field

The present disclosure relates to a semiconductor structure and an integrated circuit, and particularly, to a memory structure and a memory integrated circuit.

Description of Related Art

Memory devices can be categorized into non-volatile memory devices and volatile memory devices, based on whether if data could be retained in the memory devices after power supply is cut off. The volatile memory devices can be functioned as temporary storage media for electronic devices under operation, and an operation speed of the electronic devices are significantly affected by an operation speed of the volatile memory devices. Dynamic random access memory (DRAM) and static random access memory (SRAM) are two typical types of the volatile memory devices. DRAM has merits including high storage density, but is operated at a speed lower than an operation speed of SRAM. On the other hand, SRAM can be operated at a higher speed, but generally occupies larger area as compared to DRAM having the same storage capacity.

SUMMARY

Embodiments of the present disclosure provide a novel memory structure and a memory integrated circuit, which have improved operation efficiency and high storage density.

In an aspect of the present disclosure, a semiconductor structure is provided. The semiconductor structure comprises: first well regions and a second well region, located in a semiconductor substrate, wherein the first well regions are arranged separately along a first direction and a second direction intersected with the first direction, to form rows extending along the first direction and columns extending along the second direction, the second well region continuously extend between the first well regions, the second well region and the semiconductor substrate have a first conductive type, and the first well regions has a second conductive type complementary to the first conductive type; first transistors, located within the first well regions and having the first conductive type; second transistors, located in the second well region and having the second conductive type, wherein the first transistors are respectively adjacent and connected to one of the second transistors, and wherein the first transistor and the second transistor adjacent and connected to each other are electrically connected to a storage capacitor by a common drain terminal or a common source terminal, and form a memory cell along with the storage capacitor; and bit lines, respectively extending between two rows of the first well regions, wherein two adjacent ones of the memory cells arranged along the second direction are both electrically connected to one of the bit lines.

In some embodiments, each row of the first well regions is offset from an adjacent row of the first well regions along the first direction.

In some embodiments, each row of the first well regions is offset from an adjacent row of the first well regions by a first offset distance, and the first offset distance is greater than a length of each first well region along the first direction.

In some embodiments, each column of the first well regions is offset from an adjacent column of the first well regions along the second direction.

In some embodiments, each column of the first well regions is offset from an adjacent column of the first well regions by a second offset distance, and the second offset distance is substantially equal to a length of each first well region along the second direction.

In some embodiments, adjacent two columns of the first well regions are spaced apart from each other.

In some embodiments, two of the first transistors are disposed within each first well region, and the two of the first transistors are adjacent and connected to each other along the first direction.

In some embodiments, four of the first transistors are disposed within each first well region, the four of the first transistors include two groups each including two first transistors, and the two groups are arranged along the first direction.

In some embodiments, two of the memory cells adjacent to each other and arranged along the second direction are electrically connected to one of the bit lines by two interconnections.

In some embodiments, the two interconnections are intersected with the one of the bit lines.

In some embodiments, the semiconductor structure further comprises first word lines and second word lines, wherein each first word line is connected to one of the second word lines by an inverter, and each memory cell is electrically connected to one of the first word lines and one of the second word lines connected with each other by the inverter.

In another aspect of the present disclosure, an integrated circuit is provided. The integrated circuit comprises: a first memory cell, comprising a first transistor, a second transistor and a first storage capacitor, wherein the first and second transistors have complementary conductive types, and are electrically connected to the first storage capacitor by a common drain terminal or a common source terminal; a second memory cell, comprising a third transistor, a fourth transistor and a second storage capacitor, wherein the third and fourth transistors have complementary conductive types, and are electrically connected to the second storage capacitor by a common drain terminal or a common source terminal; and a bit line, extending between the first and second memory cells, wherein the bit line is electrically connected to drain terminals or source terminals of the first and second transistors that are not shared by the first and second transistors, and electrically connected to drain terminals or source terminals of the third and fourth transistors that are not shared by the third and fourth transistors.

In some embodiments, the integrated circuit further comprises: a first word line, electrically connected to the first and third transistors having complementary conductive types; and a second word line, electrically connected to the second and fourth transistors having complementary conductive types.

In some embodiments, the integrated circuit further comprises: an inverter, connected between the first word line and the second word line.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
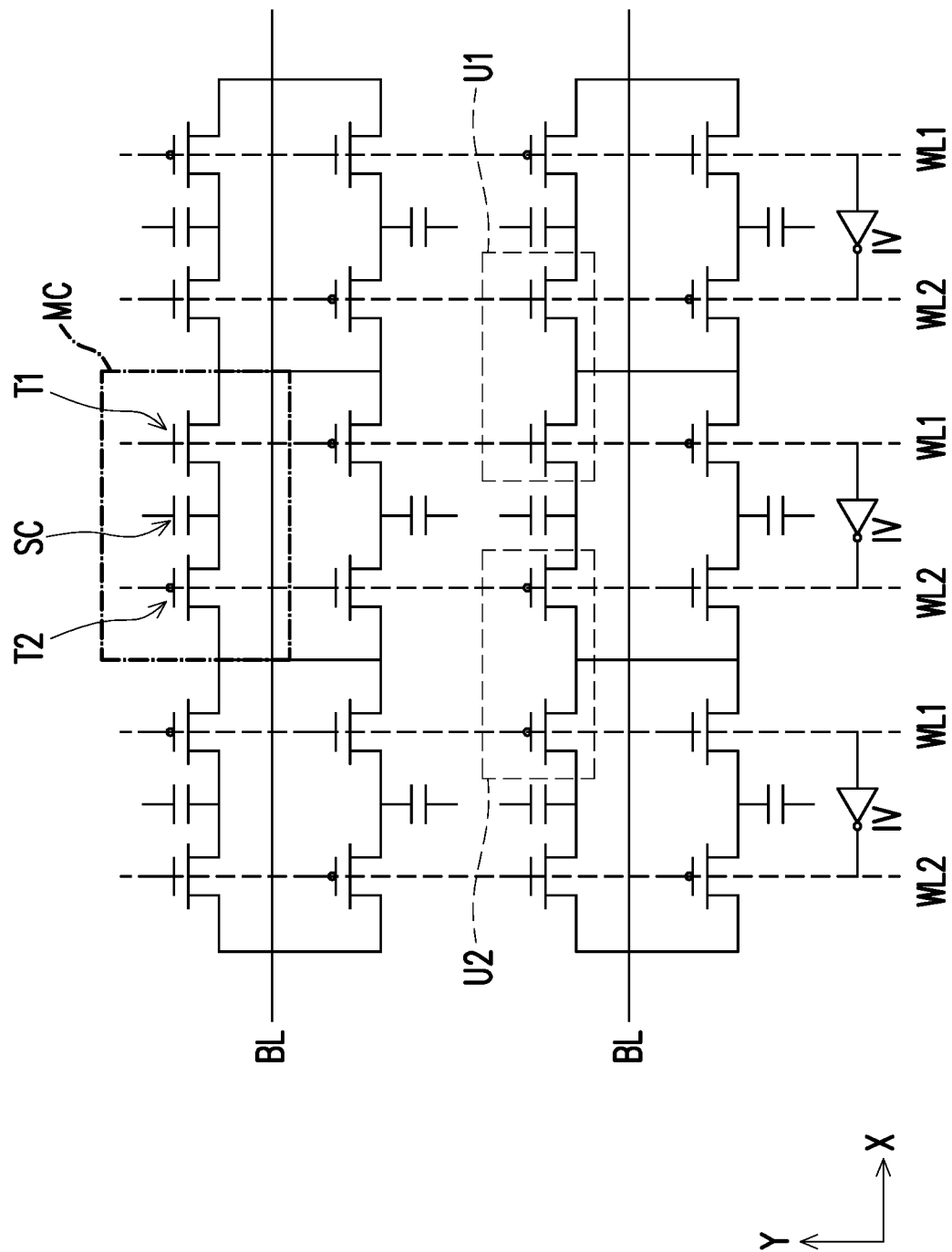
FIG. 1 is a circuit diagram illustrating an integrated circuit according to some embodiments of the present disclosure.

FIG. 1 is a circuit diagram illustrating an integrated circuit 10 according to some embodiments of the present disclosure.

Referring to FIG. 1, in some embodiments, the integrated circuit 10 is a memory integrated circuit, such as a volatile memory integrated circuit. The integrated circuit 10 may include memory cells MC arranged as an array. For instance, the memory cells MC are arranged as having columns extending along a direction Y and rows extending a direction X. The direction Y and the direction X are intersected with (e.g., perpendicular to) each other. In some embodiments, each memory cell MC includes a transistor T1 and a transistor T2 connected with each other, and includes a storage capacitor SC connected to the transistors T1, T2. The transistors T1, T2 may respectively be a metal-oxide-semiconductor field effect transistor (MOSFET), and have complementary conductive types (or referred as opposite conductive types). For instance, the transistor T1 has a first conductive type (e.g., N-type), while the transistor T2 has a second conductive type (e.g., P-type) complementary (or opposite) to the first conductive type. The transistors T1, T2 are connected to each other via a common drain terminal or a common source terminal, and a terminal of the storage capacitor SC is connected to such common drain terminal or common source terminal. In some embodiments, the transistors T1, T2 in adjacent memory cells MC arranged along the direction X are connected together. Further, in some embodiments, arrangement sequences of the transistors T1, T2 in adjacent memory cells MC arranged along the direction X may be opposite, such that the two transistors T1 or the two transistors T2 of these adjacent memory cells MC adjoin and connect with each other. The adjoining and connected two transistors T1 may constitute a repetitive unit U1, and the adjoining and connected two transistors T2 may constitute a repetitive unit U2. The repetitive units U1 and the repetitive units U2 may alternately arranged along the direction X. On the other hand, in some embodiments, the transistors T1 and the transistors T2 in each column may alternately arranged along the direction Y. In other words, in embodiments where the repetitive units U1 and the repetitive units U2 are alternately arranged along the direction X, the repetitive units U1 and the repetitive units U2 may further be alternately arranged along the direction Y.

In addition, the integrated circuit 10 may further includes word lines WL1 and word lines WL2. It should be noted that, for conciseness, the word lines WL1 and the word lines WL2 are depicted as dashed lines in FIG. 1. In some embodiments, the word lines WL1 and the word lines WL2 respectively extend along the direction Y. Gate terminals of the transistors T1, T2 in each memory cell MC are respectively connected to a word line (one of the word lines WL1 or one of the word lines WL2). The word lines WL1 and the word lines WL2 are configured to receive different voltages, such that the transistors T1, T2 in each memory cell MC can be turned on or turned off simultaneously. In some embodiments, adjacent word line WL1 and word line WL2 are connected with each other through an inverter IV. In order to turn on the transistors T1, T2 of the selected memory cell MC, the corresponding word line WL1 may receive a first logic level. The first logic level may be functioned as an input voltage of the inverter IV connected to this word line WL1, and this inverter IV may further receive a working voltage and a reference voltage (e.g., a ground voltage), and output a second logic level complementary (or opposite) to the first logic level. If the first logic level is a high logic level, this inverter IV outputs the reference voltage (the second logic level) to the word line WL2 connected to this inverter IV. As such, the transistors T1 of first conductive type (e.g., N-type) and connected to this word line WL1 are turned on, and the transistors T2 of the second conductive type (e.g., P-type) and connected to this word line WL2 are turned on as well. On the other hand, the transistors T2 of the second conductive type (e.g., P-type) and connected to this word line WL1 as well as the transistors T1 of the first conductive type (e.g., N-type) and connected to this word line WL2 are kept in an off state. In contrast, if the first logic level is a low logic level, this inverter IV outputs the working voltage (currently, the high logic level) to this word line WL2. As a consequence, the transistors T2 of the second conductive type (e.g., P-type) and connected to this word line WL1 and the transistors T1 of the first conductive type (e.g., N-type) and connected to this word line WL2 are turned on. On the other hand, the transistors T1 of the first conductive type (e.g., N-type) and connected to this word line WL1 and the transistors T2 of the second conductive type (e.g., P-type) and connected to this word line WL2 are in an off state. In those embodiments where the transistors T1 and the transistors T2 in the same column are alternately arranged along the direction Y, the transistors T1, T2 in one of the memory cells MC are in an off state when the transistors T1, T2 in adjacent one of the memory cells MC in the same column are turned on.

In some embodiments, in order to turn off the transistors T1, T2 in an entire column of memory cells MC, the corresponding word line WL1 may receive a pass voltage of which an absolute value is lower than absolute values of the threshold voltages of the transistors T1, T2. In this way, the corresponding inverter IV may be configured to receive a working voltage identical to the pass voltage, and receive a reference voltage having a polarity opposite to a polarity of the pass voltage and having an absolute value no greater than an absolute value of the pass voltage. In other words, when the pass voltage received by this word line WL1 is a positive pass voltage, the corresponding word line WL2 may receive a negative pass voltage. In contrast, when the pass voltage received by this word line WL1 is a negative pass voltage, the corresponding word line WL2 receives a positive pass voltage. Since the absolute value of the pass voltage is lower than the absolute values of the threshold voltages of the transistors T1, T2, the transistors T1, T2 in an entire column of memory cells MC connected to these word lines WL1, WL2 can be kept in an off state.

Moreover, the integrated circuit 10 further includes bit lines BL. In some embodiments, the bit lines BL extend along the direction X. In each memory cell MC, the drain/source terminals of the transistors T1, T2 that are not being shared are electrically connected to the same bit line BL. As such, the transistors T1, T2 in each memory cell MC are connected in parallel between the storage capacitor SC and one of the bit lines BL. In addition, two adjacent memory cells MC arranged along the direction Y are connected to the same bit line BL, such that this bit line BL can control these two memory cells MC. Since each memory cell MC is connected to only one of the bit lines BL, the bit lines BL are alternately disposed between rows of the memory cells MC. In other words, only a side (rather than both sides) of each row of memory cells MC is disposed with a bit line BL. In those embodiments where the transistors T1, T2 in the same column are alternately arranged along the direction Y, only the transistors T1, T2 in one of the two adjacent memory cells MC arranged along the direction Y can be turned on during a single operation. Therefore, even though the two adjacent memory cells MC arranged along the direction Y are connected to the same bit line BL, only one of the two memory cells MC is selected in a single operation (e.g., a reading operation, a programming operation or the like). Since adjacent rows of the memory cells MC can share the same bit line BL, an amount of the bit lines BL can be reduced by 50%. As a result, parasitic capacitance between the bit lines BL can be significantly reduced. Accordingly, read margin of the memory integrated circuit 10 can be effectively increased.

Figure 2A:
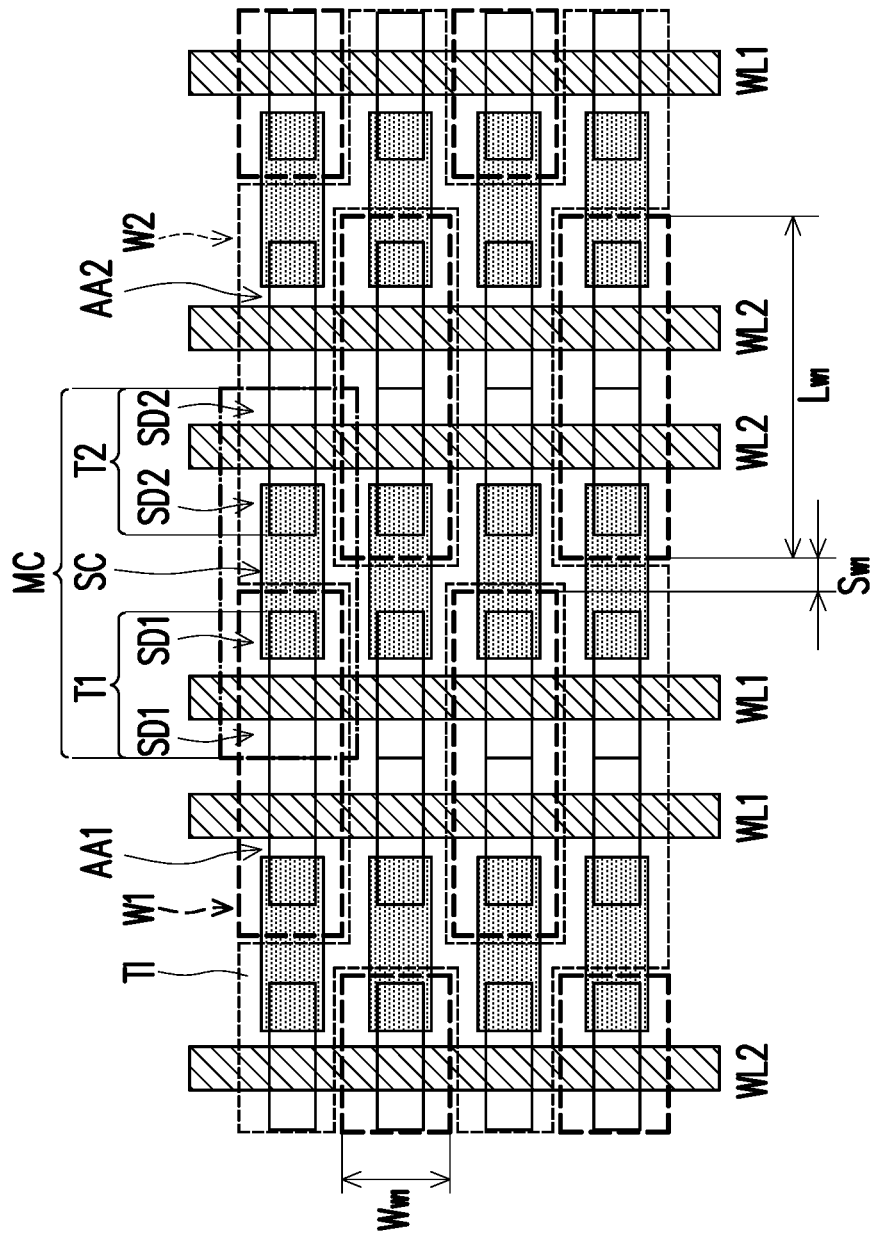
FIG. 2A and FIG. 2B are schematic plan views respectively illustrating some portions of a semiconductor structure for realizing the integrated circuit as shown in FIG. 1.
Figure 2B:
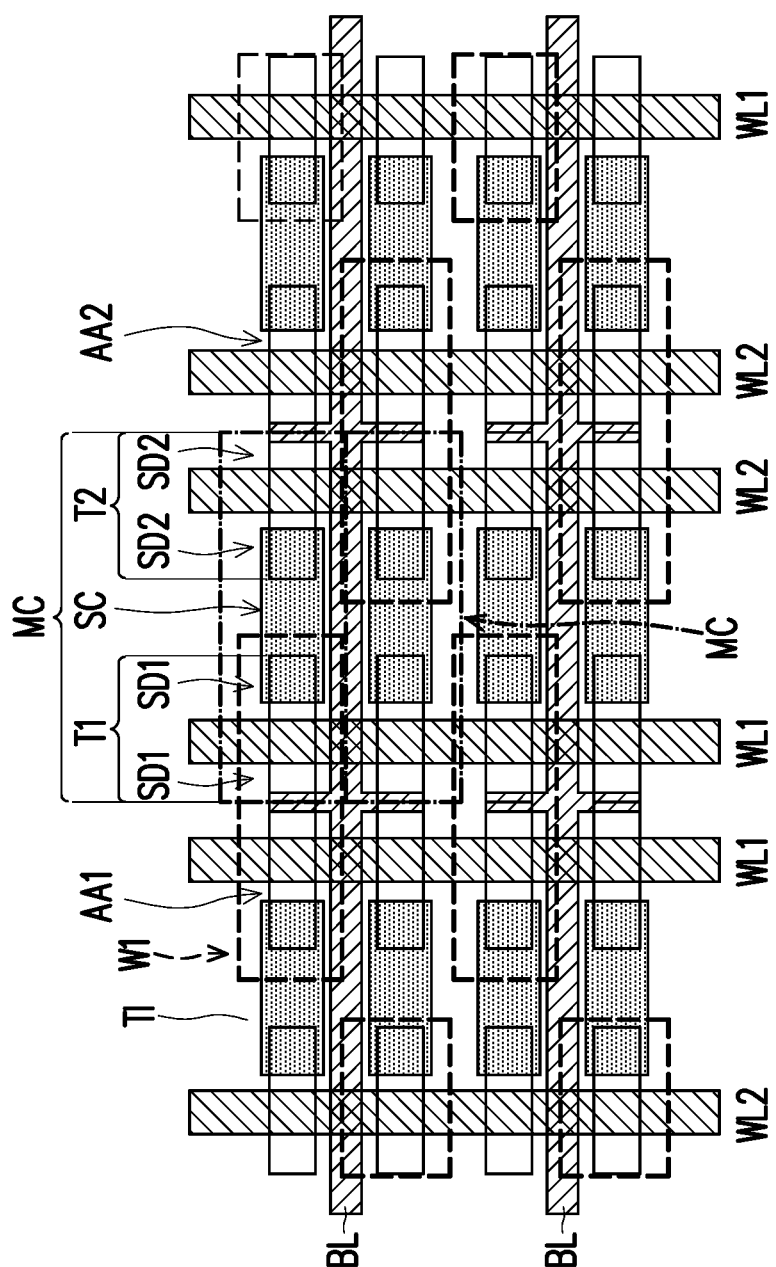

FIG. 2A and FIG. 2B are schematic plan views respectively illustrating some portions of a semiconductor structure 100 for realizing the integrated circuit 10 as shown in FIG. 1. It should be noted that, the bit lines BL and the interconnections IC are omitted from FIG. 2A, while the well region W2 is omitted from FIG. 2B.

Referring to FIG. 1 and FIG. 2A, the transistor T1 of the first conductive type (e.g., N-type) in each memory cell MC may include an active region AA1 having the second conductive type (e.g., P-type), and include a portion of one of the word lines WL1/WL2 intersected with the active region AA1. This portion of the word line WL1/WL2 intersected with the active region AA1 may be functioned as a gate terminal of the transistor T1, and portions of the active region AA1 at opposite sides of the gate terminal may be doped with the first conductive type (e.g., N-type) and may be functioned as drain and source terminals SD1 of the transistor T1. Similarly, the transistor T2 of the second conductive type (e.g., P-type) in each memory cell MC may include an active region AA2 having the first conductive type (e.g., N-type), and include a portion of one of the word lines WL2/WL1 intersected with the active region AA2. The portion of the word line WL2/WL1 intersected with the active region AA2 may be functioned as a gate terminal of the transistor T2, and portions of the active region AA2 at opposite sides of the gate terminal may be doped with the second conductive type (e.g., P-type) and may be functioned as source and drain terminals SD2 of the transistor T2. The adjacent drain or source terminals of the transistors T1, T2 in each memory cell MC (one of the source and drain terminals SD1 and one of the source and drain terminal SD2 between the word lines WL1, WL2) are both connected to the storage capacitor SC overlapped with these drain or source terminals, and may be functioned as a common drain/source terminal. The storage capacitor SC may be located above the active regions AA1, AA2, and overlapped with the active regions AA1, AA2. In addition, the word lines WL1, WL2 connected to each memory cell MC may be connected with each other through the inverter IV (as shown in FIG. 1) formed within a peripheral circuit region (not shown).

The active regions AA1 of the transistors T1 having the first conductive type (e.g., N-type) may be portions of well regions W1 in a semiconductor substrate (not shown), and the well regions W1 have the second conductive type (e.g., P-type). An isolation structure TI formed in the semiconductor substrate may define span ranges of the active regions AA1. In those embodiments where the semiconductor substrate has the second conductive type (e.g., a P-type semiconductor wafer), the well regions W1 of the second conductive type (e.g., P-type) may be portions of the semiconductor substrate. These well region W1 may be laterally spaced apart from one another, and are connected to one another through a bottom portion of the semiconductor substrate. In some embodiments, the well regions W1 are arranged as an array. In those embodiments where the arrangement sequences regarding the transistors T1, T2 of adjacent memory cells MC arranged along the direction X are opposite to each other, the transistors T1 of the adjacent memory cells MC arranged along the direction X (i.e., the repetitive unit U1 as shown in FIG. 1) may be located within the same well region W1, and the well regions W1 in the same row may be separately disposed along the direction X. Further, in those embodiments where the transistors T1, T2 are arranged alternately along the direction Y, the well regions W1 in the same column are separately disposed along the direction Y. When the well regions W1 are separately disposed along both of the direction X and the direction Y, the well regions W1 in each column may be regarded as offset from the well regions W1 in an adjacent column along the direction Y, and the well regions W1 in each row may be regarded as offset from the well regions W1 in an adjacent row along the direction X. The well regions W1 in each column may offset from the well regions W1 in an adjacent column along the direction Y by a distance substantially equal to a length $W_{W1}$ of the well region W1 along the direction Y. In addition, the well regions W1 in each row may offset from the well regions W1 in an adjacent row along the direction X by a distance greater than a length $L_{W1}$ of the well region W1 along the direction X, and may substantially equal to a total length of the length $L_{W1}$ and a non-zero distance $S_{W1}$. The non-zero distance $S_{W1}$ is a spacing between adjacent columns of the well regions W1.

On the other hand, the active regions AA2 of the transistors T2 having the second conductive type (e.g., P-type) are portions of a well region W2 in the semiconductor substrate, and the well region W2 has the first conductive type (e.g., N-type). Similar to the active regions AA1, span ranges of the active regions AA2 may also be defined by the isolation structure TI formed in the semiconductor substrate. The well region W2 continuously spreads between the well regions W1 laterally spaced apart from one another. As such, when the well region W2 is configured to receive a certain voltage, an amount of the input/output can be significantly reduced. In those embodiments where the semiconductor substrate has the second conductive type (e.g., P-type), the well region W2 is a doped region having the first conductive type (e.g., N-type).

Referring to FIG. 1 and FIG. 2B, each bit line BL is disposed between adjacent rows of the memory cells MC, and two adjacent memory cells MC arranged along the direction Y are both connected to the bit line BL extending in between, and both controlled by this bit line BL. In this way, each bit line BL extends between two adjacent rows of the well regions W1, and extends across some portions of the well region W2 (continuously extending between the well regions W1). In addition, since the bit lines BL are alternately disposed between rows of the memory cells MC (as described with reference to FIG. 1), the bit lines BL are alternately disposed between rows of the well regions W1. In some embodiments, the drain or source terminals of the transistors T1, T2 (except for the common drain/source terminal connected to the storage capacitor SC) in each memory cell MC are respectively connected to the corresponding bit line BL through an interconnection IC. Further, the two interconnections IC electrically connecting each memory cell MC to the corresponding bit line BL further extend along the direction Y to another memory cell MC, and electrically connect the transistors T1, T2 in this another memory cell MC to the bit line BL. In some embodiments, each interconnection IC extends along the direction Y, and is intersected with one of the bit lines BL. In addition, adjacent interconnections IC arranged along the direction Y are laterally spaced apart and electrically isolated from each other. Moreover, in some embodiments, the interconnections IC and the bit lines BL are different portions of the same metallization layer, and located over the semiconductor substrate (not shown) and the word lines WL1, WL2.

Figure 3:
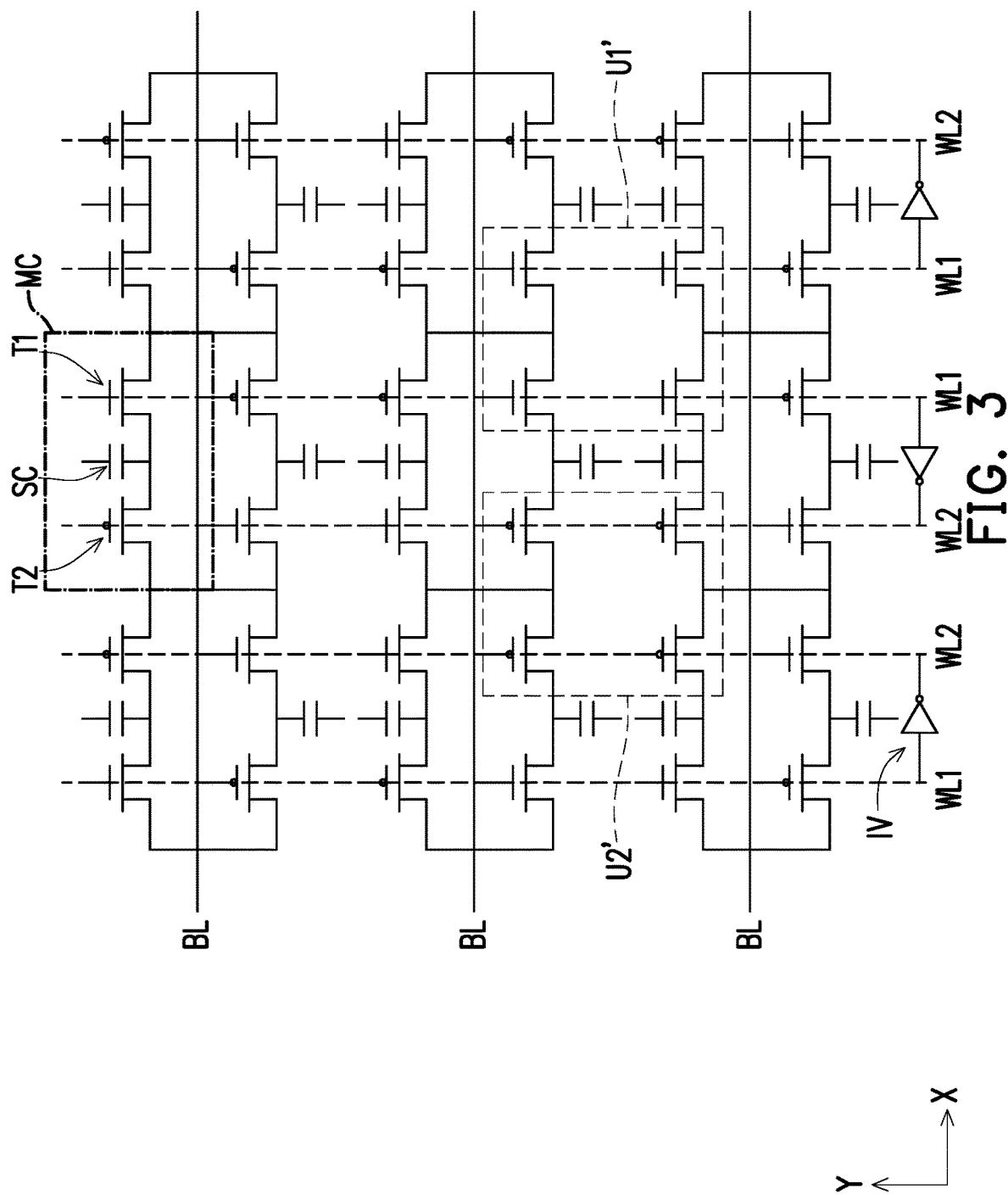
FIG. 3 is a circuit diagram illustrating an integrated circuit according to alternative embodiments of the present disclosure.

FIG. 3 is a circuit diagram illustrating an integrated circuit 10a according to alternative embodiments of the present disclosure. The integrated circuit 10a shown in FIG. 3 is similar to the integrated circuit 10 shown in FIG. 1. Only differences therebetween will be described, the same or the like parts would not be repeated again. In addition, identical or similar labels indicate identical or similar components.

Referring to FIG. 3, in the alternative embodiments, an arrangement sequence of the transistors T1, T2 in one of the memory cells MC is identical with an arrangement sequence of the transistors T1, T2 in an adjacent one of the memory cells MC arranged along the direction Y (e.g., positive direction Y), but is opposite to an arrangement sequence of the transistors T1, T2 in another adjacent one of the memory cells MC arranged along the direction Y (e.g., negative direction Y). In the adjacent memory cells MC arranged along the direction Y and having identical arrangement sequences, two transistors T1 are arranged along the direction Y, and two transistors T2 are arranged along the direction Y as well. Further, the adjacent memory cells MC arranged along the direction Y and having opposite arrangement sequences are controlled by the bit line BL extending therebetween, while a bit line is absent in between the adjacent memory cells MC arranged along the direction Y and having identical arrangement sequences. Moreover, arrangement sequences of the transistors T1, T2 in adjacent memory cells MC arranged along the direction X may be opposite, such that two transistors T1 or two transistors T2 in these memory cells MC are adjacent to each other. In this way, the arrangement sequences of two adjacent memory cells MC arranged along the direction Y may be identical with each other but opposite to the arrangements sequences of other two memory cells MC disposed aside (along the direction X), such that four transistors T1 in these four memory cells MC cluster together to form a repetitive unit U1'. Similarly, four transistors T2 in four adjacent memory cells MC cluster together, and form a repetitive unit U2'. The repetitive units U1' and the repetitive units U2' are alternately arranged along the direction X and the direction Y, and form a transistor array of the integrated circuit 10a. On the other hand, the repetitive unit U1 in the integrated circuit 10 shown in FIG. 1 only include two transistors T1, and the repetitive unit U2 only include two transistors T2.

Figure 4A:
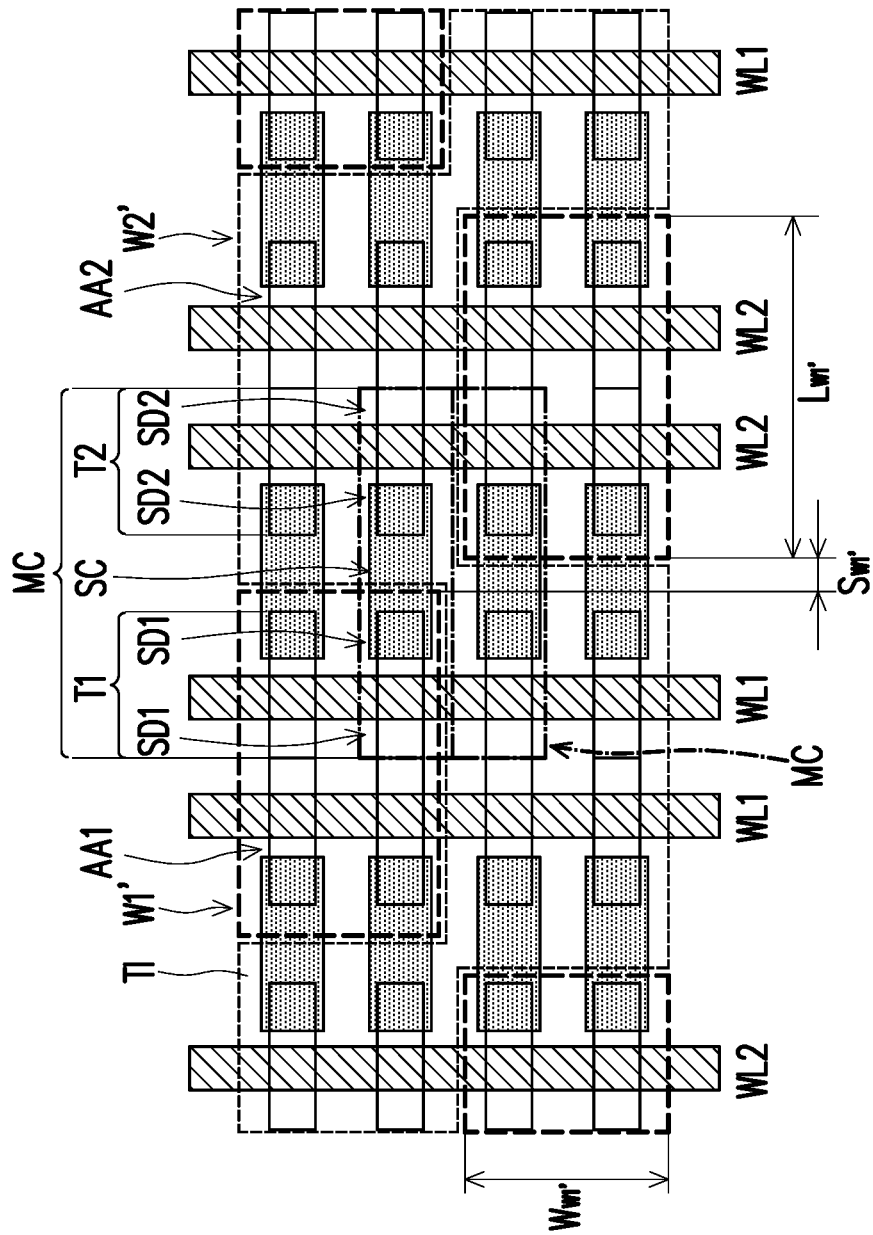
FIG. 4A and FIG. 4B are schematic plan views respectively illustrating some portions of a semiconductor structure for realizing the integrated circuit as shown in FIG. 3.
Figure 4B:
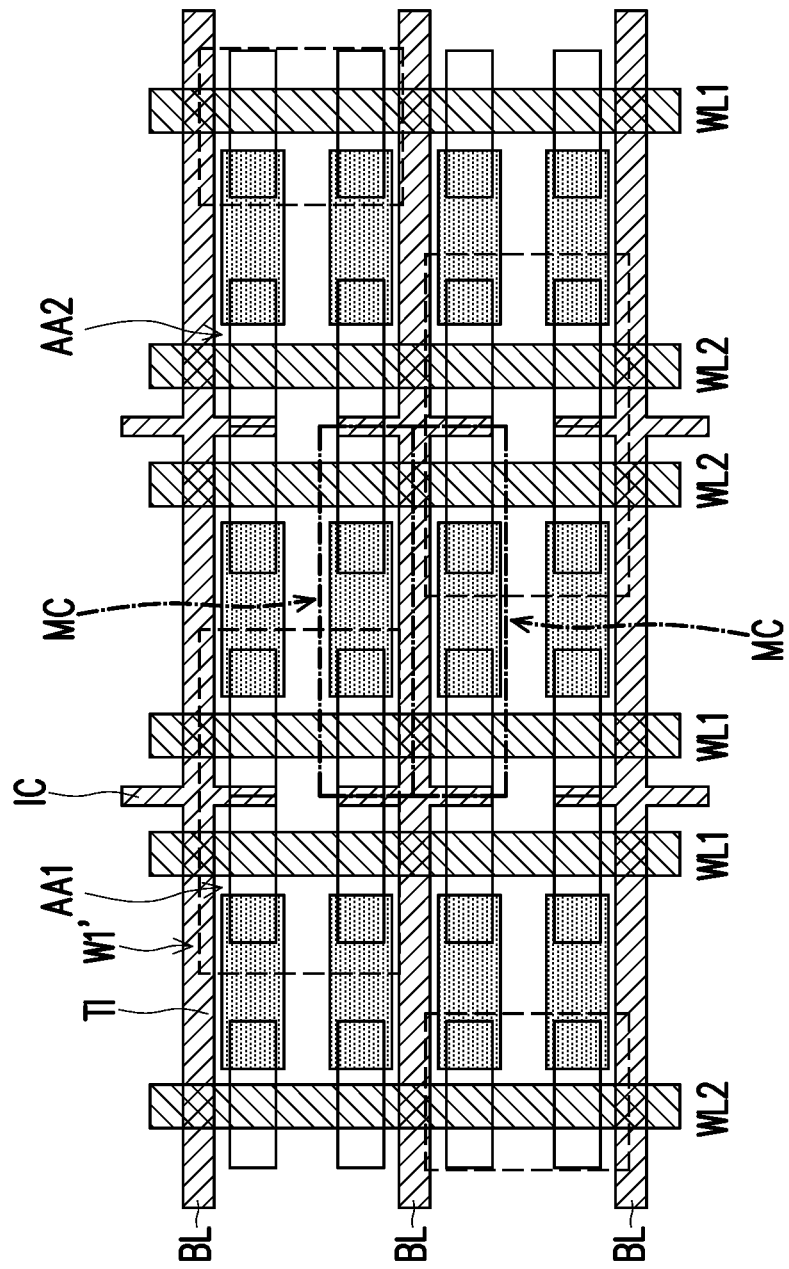

FIG. 4A and FIG. 4B are schematic plan views respectively illustrating some portions of a semiconductor structure 100a for realizing the integrated circuit 10a as shown in FIG. 3. It should be noted that, the bit lines BL and the interconnections IC are omitted from FIG. 4A, and the well region W2' is omitted from FIG. 4B. The semiconductor structure 100a shown in FIG. 4A and FIG. 4B is similar to the semiconductor structure 100 shown in FIG. 2A and FIG. 2B. Only differences therebetween will be described, the same or the like parts would not be repeated again. In addition, identical or similar labels indicate identical or similar components.

Referring to FIG. 3 and FIG. 4A, as described with reference to FIG. 3, four transistors T1 or four transistors T2 in four adjacent memory cells MC may cluster together to form a repetitive unit (i.e., the repetitive unit U1' or the repetitive unit U2' as described with reference to FIG. 3). Therefore, the repetitive units each including four transistors T1 (i.e., the repetitive units U1' as described with reference to FIG. 3) may respectively be disposed within the same well region W1', while the repetitive units each including four transistors T2 (i.e., the repetitive units U2' as described with reference to FIG. 3) may be disposed within a well region W2' spreading between the well regions W1'. The well regions W1' are separated from one another along the direction X and the direction Y, and are arranged in columns and rows. Each column of the well regions W1' may be regarded as offset from adjacent column of the well regions W1' along the direction Y, and each row of the well regions W1' may be regarded as offset from adjacent row of the well regions W1' along the direction X. The adjacent columns of the well regions W1' may offset from each other along the direction Y by a distance substantially equal to a length $W_{W1'}$ of the well region W1' along the direction Y. Since four transistors T1 arranged in two rows are located within each well region W1', the length $W_{W1'}$ of each well region W1' along the direction Y is about two times of the length $W_{W1}$ as shown in FIG. 2A. In addition, adjacent rows of the well regions W1' may offset from each other along the direction X by a distance greater than a length $L_{W1'}$ of the well region W1' along the direction X, and may substantially equal to a total length of the length $L_{W1'}$ and a non-zero distance $S_{W1'}$. The length $L_{W1'}$ and the non-zero distance $S_{W1'}$ shown in FIG. 4A are substantially identical to the length $L_{W1}$ and the non-zero distance $S_{W1}$ shown in FIG. 2A, respectively. In addition, the non-zero distance $S_{W1}/S_{W1'}$ is a spacing between adjacent columns of the well regions W1/W1'.

As compared to the well region W1 described with reference to FIG. 2A, the well region W1' described with reference to FIG. 4A includes more of the transistors T1, and has a greater footprint area. As a consequence, the layout shown in FIG. 4A may include fewer well regions W1', so as to reduce interface between the well regions W1' and the well region W2'. A semiconductor junction (e.g., a PN junction) may be formed at an interface between the well regions W1' having the second conductive type (e.g., P-type) and the well region W2' having the first conductive type (e.g., N-type), and current may flow through this semiconductor junction at certain situation, so as to form leakage current. Reducing this interface between the well regions W1' and the well region W2' may reduce an area of the semiconductor junction, so as to reduce the leakage current.

Referring to FIG. 3 and FIG. 4B, each bit line BL extends between adjacent rows of the well regions W1', and extends across some portions of the well region W2' (continuously extending between the well regions W1', and is not shown in FIG. 4B). As such, two adjacent memory cells MC arranged along the direction Y can be both electrically connected to the bit line BL extending in between through the interconnections IC, and both controlled by this bit line BL. In addition, as described with reference to FIG. 2B, the bit lines BL are alternately disposed between rows of the well regions W1'.

As above, the semiconductor structure and the integrated circuit according to embodiments of the present disclosure include memory cells arranged in an array. Each memory cell includes two transistors having complementary (or opposite) conductive types and connected in parallel, and includes a storage capacitor connected to a common drain terminal or a common source terminal of these two transistors. As compared to a SRAM cell having more transistors, the memory cell according to embodiments of the present disclosure has a smaller footprint area. On the other hand, as compared to a DRAM cell having a single transistor and a storage transistor, the memory cell according to embodiments of the present disclosure has a lower on-resistance due to parallel connection of its two transistors, thus has improved operation speed. In addition, in embodiments of the present disclosure, two adjacent memory cells in the same column can be connected to the same bit line. As such, a total amount of the bit lines can be reduced by 50%, and parasitic capacitance between the bit lines can be significantly reduced. Therefore, read margin of the memory cell can be effectively improved. Furthermore, the transistors of the same conductive type in the memory cells may be disposed in well regions separately disposed along a column direction and a row direction, and the transistors of another conductive type may be disposed in another well region continuously spreading between the afore-mentioned separate well regions. By arranging the memory cells in such layout, storage density can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:
   first well regions and a second well region, located in a semiconductor substrate, wherein the first well regions are arranged separately along a first direction and a second direction intersected with the first direction, to form rows extending along the first direction and columns extending along the second direction, the second well region continuously extend between the first well regions, the second well region and the semiconductor substrate have a first conductive type, and the first well regions has a second conductive type complementary to the first conductive type;
   first transistors, located within the first well regions and having the first conductive type;
   second transistors, located in the second well region and having the second conductive type, wherein the first transistors are respectively adjacent and connected to one of the second transistors, and wherein the first transistor and the second transistor adjacent and connected to each other are electrically connected to a storage capacitor by a common drain terminal or a common source terminal, and form a memory cell along with the storage capacitor; and
   bit lines, respectively extending between two rows of the first well regions, wherein two adjacent ones of the memory cells arranged along the second direction are both electrically connected to one of the bit lines.

2. The semiconductor structure according to claim 1, wherein each row of the first well regions is offset from an adjacent row of the first well regions along the first direction.

3. The semiconductor structure according to claim 2, wherein each row of the first well regions is offset from an adjacent row of the first well regions by a first offset distance, and the first offset distance is greater than a length of each first well region along the first direction.

4. The semiconductor structure according to claim 1, wherein each column of the first well regions is offset from an adjacent column of the first well regions along the second direction.

5. The semiconductor structure according to claim 1, wherein each column of the first well regions is offset from an adjacent column of the first well regions by a second offset distance, and the second offset distance is substantially equal to a length of each first well region along the second direction.

6. The semiconductor structure according to claim 1, wherein adjacent two columns of the first well regions are spaced apart from each other.

7. The semiconductor structure according to claim 1, wherein two of the first transistors are disposed within each first well region, and the two of the first transistors are adjacent and connected to each other along the first direction.

8. The semiconductor structure according to claim 1, wherein four of the first transistors are disposed within each first well region, the four of the first transistors include two groups each including two first transistors, and the two groups are arranged along the first direction.

9. The semiconductor structure according to claim 1, wherein two of the memory cells adjacent to each other and arranged along the second direction are electrically connected to one of the bit lines by two interconnections.

10. The semiconductor structure according to claim 9, wherein the two interconnections are intersected with the one of the bit lines.

11. The semiconductor structure according to claim 1, further comprising first word lines and second word lines, wherein each first word line is connected to one of the second word lines by an inverter, and each memory cell is electrically connected to one of the first word lines and one of the second word lines connected with each other by the inverter.

12. An integrated circuit, comprising:
   a first memory cell, comprising a first transistor, a second transistor and a first storage capacitor, wherein the first and second transistors have complementary conductive types, and are electrically connected to the first storage capacitor by a common drain terminal or a common source terminal;
   a second memory cell, comprising a third transistor, a fourth transistor and a second storage capacitor, wherein the third and fourth transistors have complementary conductive types, and are electrically connected to the second storage capacitor by a common drain terminal or a common source terminal; and a bit line, extending between the first and second memory cells, wherein the bit line is electrically connected to drain terminals or source terminals of the first and second transistors that are not shared by the first and second transistors, and electrically connected to drain terminals or source terminals of the third and fourth transistors that are not shared by the third and fourth transistors.

13. The integrated circuit according to claim 12, further comprising:

a first word line, electrically connected to the first and third transistors having complementary conductive types; and a second word line, electrically connected to the second and fourth transistors having complementary conductive types.

14. The integrated circuit according to claim 13, further comprising:

an inverter, connected between the first word line and the second word line.

* * * * *